US006850753B2

(12) United States Patent
Zhang et al.

(10) Patent No.: US 6,850,753 B2
(45) Date of Patent: Feb. 1, 2005

(54) TUNABLE LOW NOISE AMPLIFIER AND CURRENT-REUSED MIXER FOR A LOW POWER RF APPLICATION

(75) Inventors: Zhao-Feng Zhang, Nan-Ching (TW); David Jan-Chia Chen, Taipei (TW); Zhen-Chuan Liu, Cerritos, CA (US); Meng-Hsiang Lai, Hsinchu (TW)

(73) Assignee: MuChip Co., Ltd, Taipei (TW)

( * ) Notice: Subject to any disclaimer, the term of this patent is extended or adjusted under 35 U.S.C. 154(b) by 428 days.

(21) Appl. No.: 10/171,068

(22) Filed: Jun. 11, 2002

(65) Prior Publication Data

US 2003/0228858 A1 Dec. 11, 2003

(51) Int. Cl.⁷ ................................................ H04B 1/16
(52) U.S. Cl. ...................... 455/341; 455/333; 455/326; 327/359
(58) Field of Search ............................ 455/194.2, 197.2, 455/262, 311, 313, 323, 324, 326, 333, 341; 330/310, 253, 254; 327/355, 356, 357, 358, 359, 360, 361

(56) References Cited

U.S. PATENT DOCUMENTS

| 6,133,793 A | * | 10/2000 | Lau et al. ..................... 330/302 |
| 6,545,534 B1 | * | 4/2003 | Mehr ........................... 330/69 |
| 6,639,447 B2 | * | 10/2003 | Manku et al. ............... 327/359 |
| 6,650,883 B1 | * | 11/2003 | Stephane et al. ........... 455/313 |
| 2002/0004376 A1 | * | 1/2002 | Lee et al. .................... 455/326 |
| 2003/0194984 A1 | * | 10/2003 | Tonich et al. ............... 455/323 |

* cited by examiner

*Primary Examiner*—Nguyen T. Vo
*Assistant Examiner*—Nhan T. Le

(57) ABSTRACT

A radio frequency front-end receiver includes a single stage low noise amplifier connected with a resistor array and a capacitor array, and a Gilbert-type mixer connected with a PMOS transconductance stage, an inductor and a serially connected current source. The resistor array enables the adjustment of the power gain of the low noise amplifier. The capacitor array tunes the low noise amplifier so that the maximum power gain is at the desired operating frequency. The PMOS transconductance stage reduces the power consumption of the mixer. The inductor increases the impedance and the current source improves the common-mode rejection of the mixer.

11 Claims, 6 Drawing Sheets

TUNABLE LOW NOISE AMPLIFIER AND CURRENT-REUSED MIXER FOR A LOW POWER RF APPLICATION

FIELD OF THE INVENTION

The present invention generally relates to a radio frequency (RF) front end receiver in wireless communication, and more specifically to the low noise amplifier and mixer in the RF front end receiver for improving its performance.

BACKGROUND OF THE INVENTION

FIG. 1 shows a block diagram of the receiver end of a conventional wireless RF system. The RF system comprises an antenna 10 for receiving a weak RF signal which is first amplified by a low noise amplifier 120 in the receiver 12. The amplified RF signal is then mixed in a mixer 124 with the output of a local oscillator 14 to form a mixed signal that includes both intermediate frequency and microwave signals.

A conventional low noise amplifier normally includes two stages in order to achieve the goal of adjusting the power gain of the low noise amplifier. FIG. 2A shows the first stage of a conventional low noise amplifier which comprises a first inductor 20, a second inductor 21, a first MOS transistor 22 and a second MOS transistor 23. The second inductor 21 serves as a serial feedback to match and reduce the noise of the low noise amplifier. The second stage that is not shown in FIG. 2A is used to adjust the power gain of the amplifier.

Because of the two stage circuit design, the conventional low noise amplifier has the drawbacks of high power consumption and complicated design. Furthermore, the second inductor 21 in the conventional amplifier is often designed into the architecture of a single chip. However, this inductance value can not be too small. In order to increase the power gain of the low noise power amplifier, the quality factor Q values of the first and second inductors 20, 21 have to be sufficiently large. Therefore, external inductors with high quality factor Q values are required. This makes the adjustment of the efficiency of the low noise power amplifier very difficult.

FIG. 2B shows the circuit of a conventional Gilbert-type mixer 124. The RF signal is modulated by an oscillation signal in a transconductance stage formed by a third MOS transistor 28 and a fourth MOS transistor 29 to accomplish the effect of wave mixing. The oscillation signal of a local oscillator (LO) enters the mixer 124 through a switching circuit comprising a fifth MOS transistor 24, a sixth MOS transistor 25, a seventh MOS transistor 26 and an eighth MOS transistor 27.

A drawback of the Gilbert-type mixer 124 is that it can not improve the signal to noise ratio and reduce the power consumption at the same time. The current in the switching circuit is proportional to the current in the transconductance stage. The input noise is proportional to the current in the switching circuit but inversely proportional to the current in the transconductance stage. Because of the relationship among the input noise, the current in the switching circuit and the current in the transconductance stage, it is necessary to increase the current in the transductance stage as well as decrease the current in the switching circuit in order to reduce the noise. However, the two requirements are contradictory. The only choice is to increase the power consumption which also increases the noise in the switching circuit. Therefore, a trade-off has to be made between low noise and high power consumption in a conventional mixer. It is very difficult to design a mixer with both low noise and low power consumption.

SUMMARY OF THE INVENTION

This invention has been made to overcome the above mentioned drawbacks of the conventional low noise amplifier and mixer used in the wireless communication. The primary object of this invention is to provide a radio frequency front-end receiver that has the advantage of both low noise and low power consumption.

Accordingly, the radio frequency front-end receiver of the present invention comprises an improved single stage low noise amplifier and an improved Gilbert-type mixer. The single stage low noise amplifier has a resistor array connected thereon for adjusting the power gain of the amplifier. It also has a capacitor array connected thereon for tuning the amplifier so that the maximum power gain of the low noise amplifier is at the desired operating frequency.

The improved Gilbert-type mixer includes a PMOS transconductance stage that comprises two PMOS transistors for reducing the power consumption within given power gain and circuit linearity. An inductor is connected to the Gilbert-type mixer in order to provide high impedance under the operating frequency. The Gilbert-type mixer is also connected in serial with a current source circuit that has a pair of MOS transistors to increase the input impedance as well as improve the common-mode rejection ratio of the mixer.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
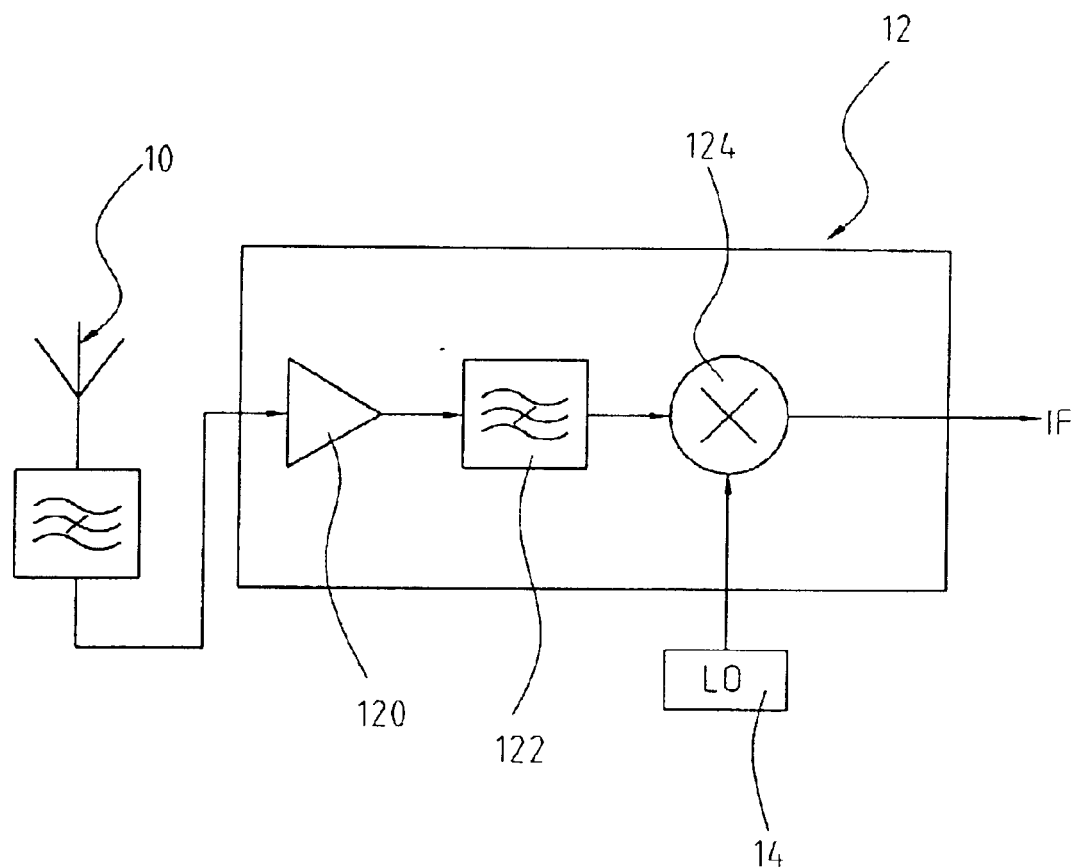
FIG. 1 shows the radio frequency front-end receiver of a conventional wireless communication system.
Figure 2A:
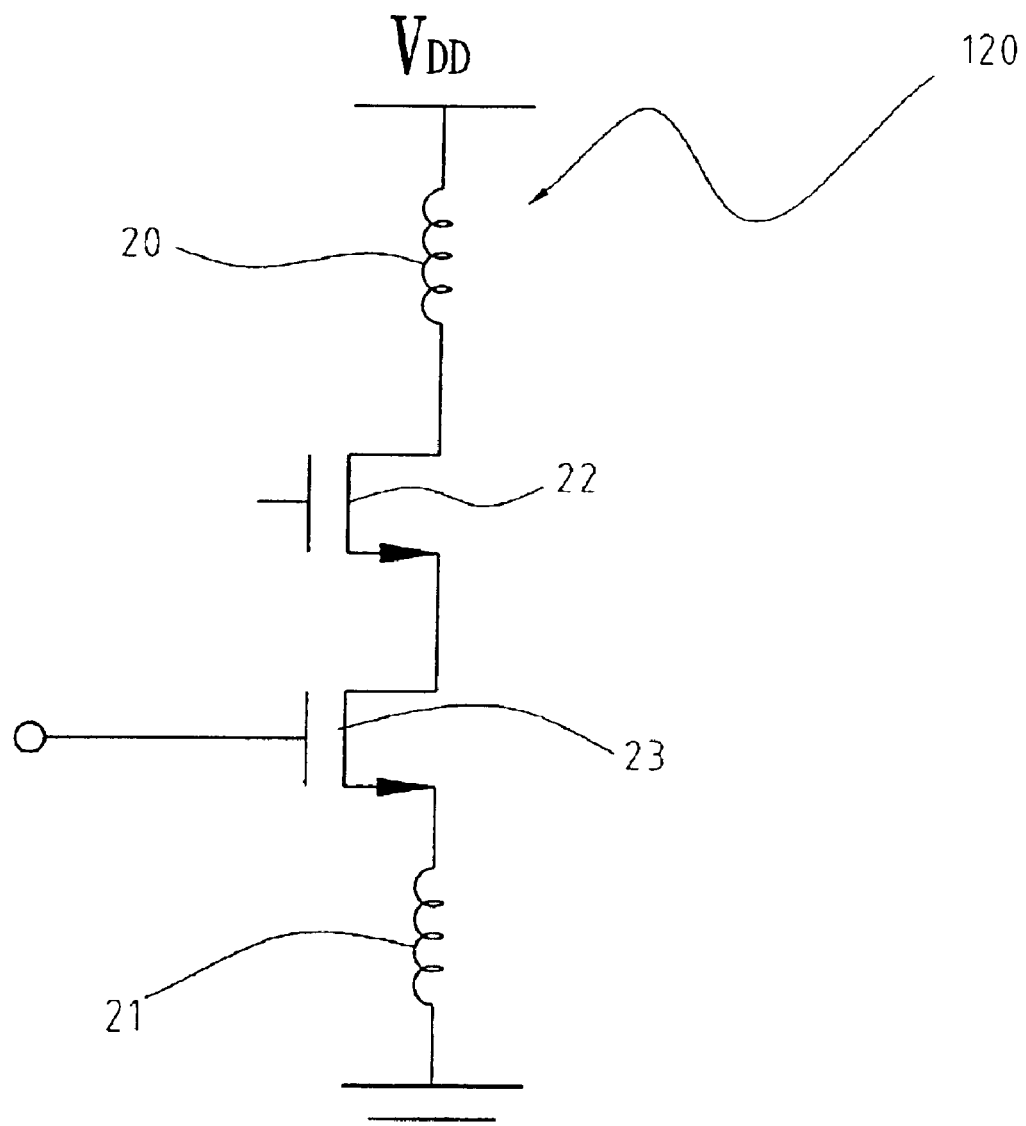
FIG. 2A shows the circuit diagram of a conventional low noise amplifier.
Figure 2B:
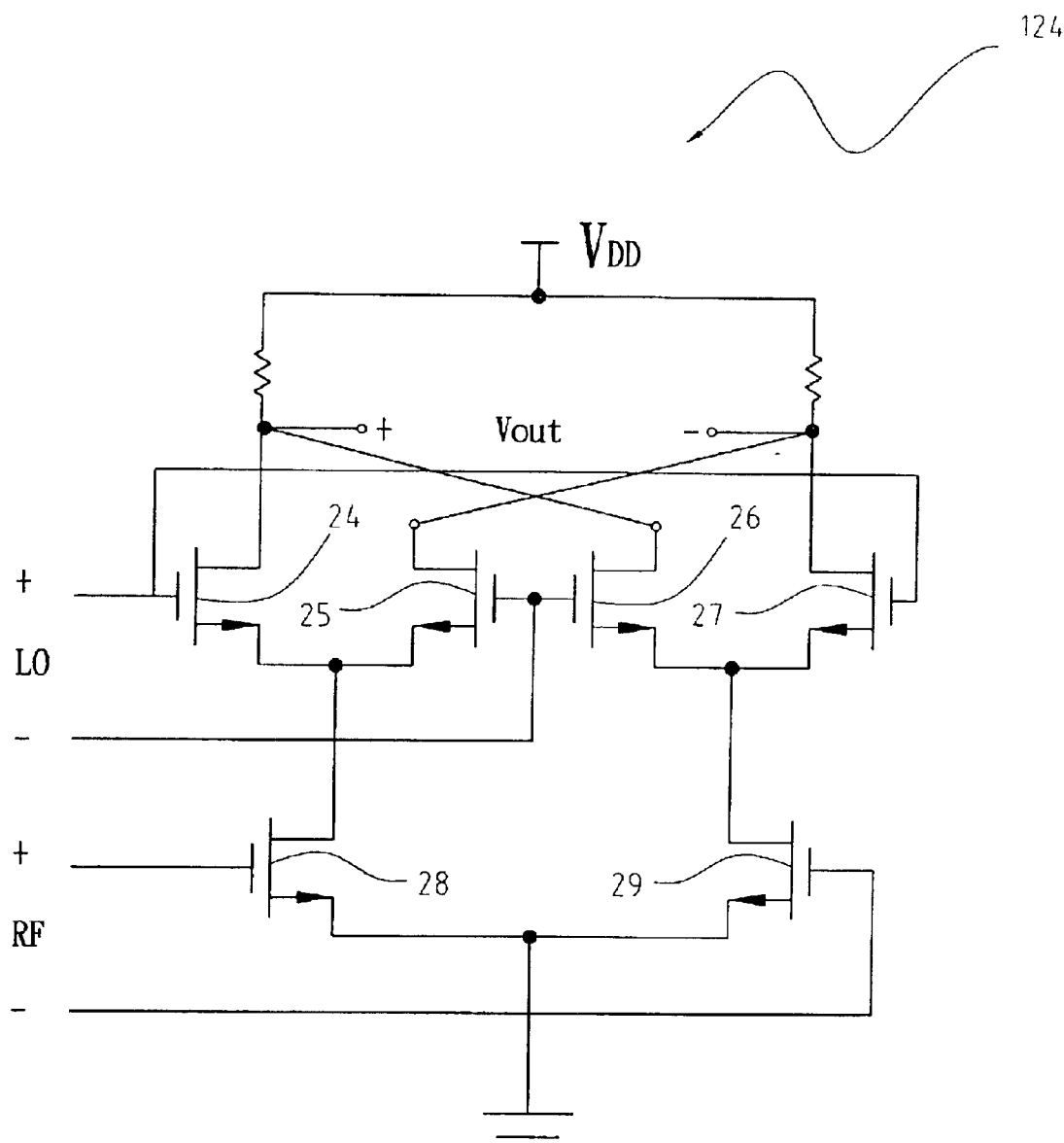
FIG. 2B shows the circuit diagram of a conventional Gilbert-type mixer.
Figure 3A:
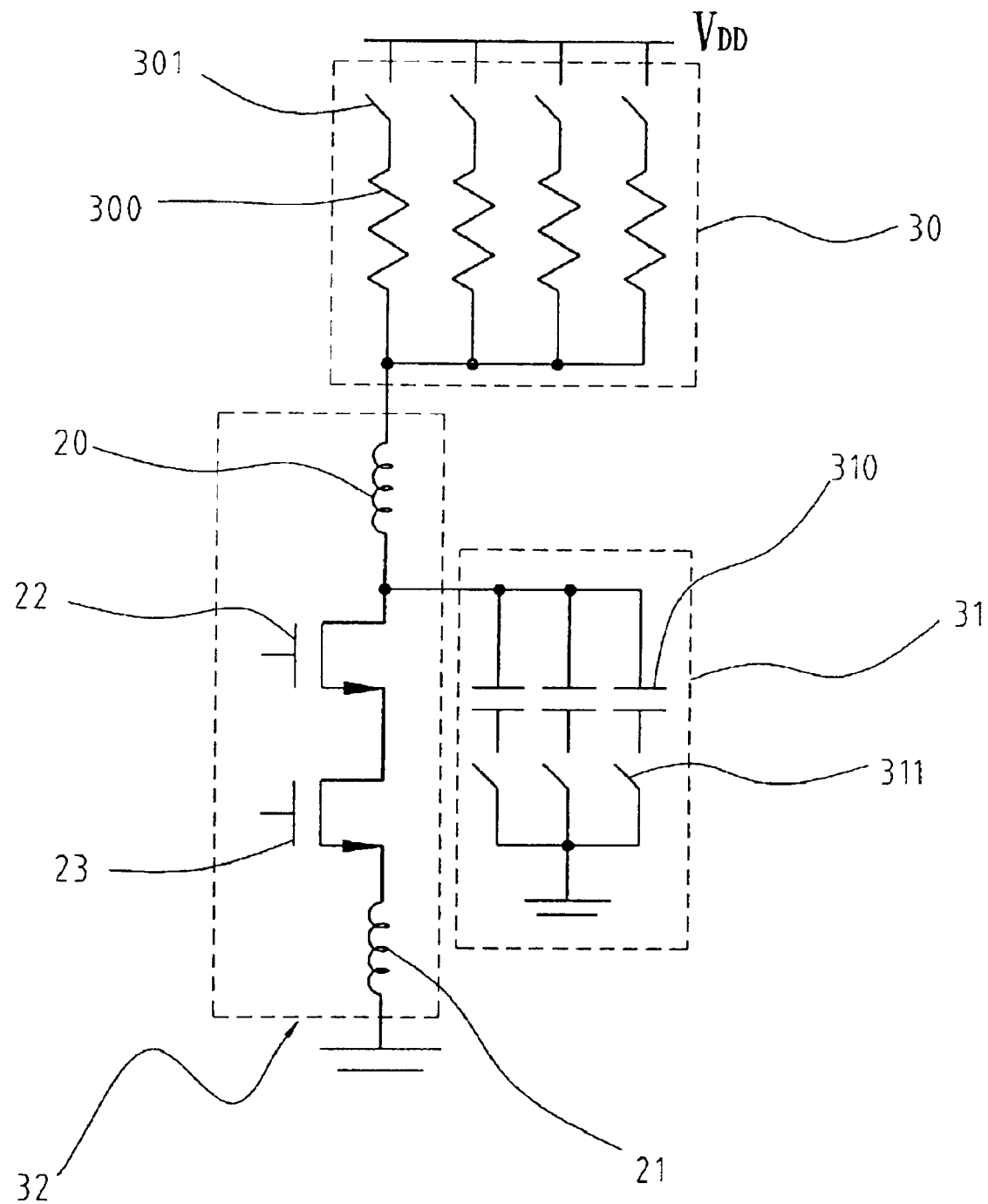
FIG. 3A shows the circuit diagram of the low noise amplifier according to the present invention.
Figure 3:
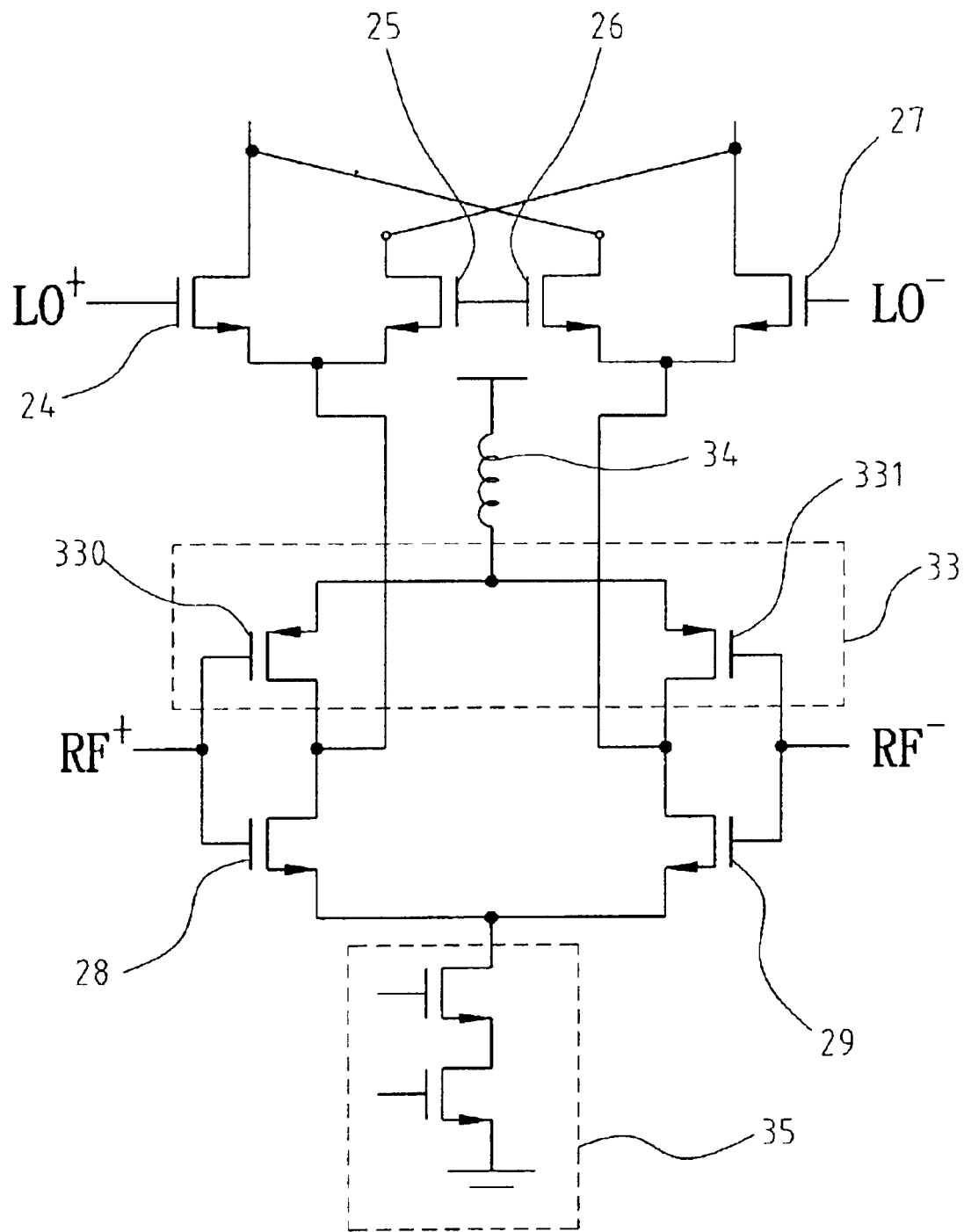
FIG. 3B shows the circuit diagram of the mixer according to the present invention.

FIG. 3A shows the circuit of the low noise amplifier according to the present invention. As can be seen from the figure, a resistor array 30 and a capacitor array 31 are connected to the first stage low noise amplifier 32 illustrated in FIG. 2A of a conventional two stage amplifier. The resistor array 30 comprises a plurality of resistor devices connected in parallel. Each resistor device includes a resistor 300 connected in serial with a switch 301. One end of the resistor array 30 is connected to the positive voltage VDD and the other end is connected to a first terminal of a first inductor 20. The equivalent resistance of the resistor array 30 can be varied by switching on or off some of the switches 301 in order to adjust the desired power gain of the low noise amplifier of the present invention.

The capacitor array 31 comprises a plurality of capacitor devices connected in parallel. Each capacitor device includes a capacitor 310 connected in serial with a switch 311. One end of the capacitor array 31 is connected to the ground and the other end is connected to a second terminal of the first inductor 20. Similarly, the equivalent capacitance of the capacitor array 31 can be varied by switching on or off some of the switches 311 to tune the low noise amplifier so that the maximum power gain is at the operating frequency.

The low noise amplifier according to the present invention has several advantages. First of all, the design is simple and the power consumption is low because the circuit has only one stage. Secondly, only the second inductor 21 has to be a device external to the single chip of the low noise power amplifier. Therefore, the noise interference to the signal in the single chip is greatly reduced. Thirdly, when the power gain is adjusted, the input impedance is not affected. Furthermore, the layout routing of this design is parasitic insensitive.

The resistor array and the capacitor array in the present invention can be controlled either digitally or in analogue. For example, instead of connecting a switch to a resistor in a resistor device of the resistor array 30, the resistor device can also be a voltage controlled variable resistor. Each capacitor device in the capacitor array 31 can also be replaced by a voltage controlled variable capacitor. In the low noise amplifier, the connection of the first and second inductors 20, 21 to first and second MOS transistors 22, 23 is the same as in a conventional low noise amplifier.

FIG. 3B shows the circuit of the mixer according to the present invention. As can be seen from the figure, a PMOS transconductance stage 33, a third inductor 34 and a serially connected current source circuit 35 are connected to a conventional Gilbert-type mixer. The PMOS transconductance stage 33 comprises a first PMOS transistor 330 and a second PMOS transistor 331. The source of the first PMOS transistor 330 is connected to the source of the second PMOS transistor 331 as well as one end of the third inductor 34. The gate of the first PMOS transistor 330 is connected to the gate of a third MOS transistor 28. The drain of the first PMOS transistor 330 is connected to the drain of the third MOS transistor 28.

The gate of the second PMOS transistor 331 is connected to the gate of a fourth MOS transistor 29. The drain of the second PMOS transistor 331 is connected to the drain of the fourth MOS transistor 29. The function of the PMOS transconductance stage 33 is to reduce the power consumption of the mixer within given gain and linearity. The function of the third inductor 34 is to provide high impedance at the operating frequency. In addition, the third inductor 34 also has the advantage of common-mode rejection and low operating voltage because it has no direct current voltage drop.

The current source circuit 35 connected in serial includes a pair of MOS transistor. One end of the current source circuit 35 is connected to the source of the third MOS transistor 28 and the source of the fourth MOS transistor 29. The other end of the current source circuit 35 is connected to ground. The two MOS transistors in the current source circuit 35 not only provide high output impedance but also increase the common-mode rejection ratio of the mixer. Therefore, the mixer has good ability to reject common-mode noise.

The receiver of this invention has a single input and differential outputs. It eliminates the need to have a single input/different output converter. Because the invention employs current-reused circuit topology, the low noise amplifier of this invention requires only half of the current used in a conventional mixer under the same power gain and linearity with at least 3 dB improvement of noise. Therefore, the invention consumes only about half of the power consumed by a conventional mixer.

The current in the transconductance stage can be increased and the current in the switching circuit of a conventional Gilbert-type mixer can be decreased to reduce the noise. Because the power gain, noise reduction and circuit linearity can be optimized separately, the present invention achieves the advantages of both low noise and low power consumption without compromise.

Figure 4A:
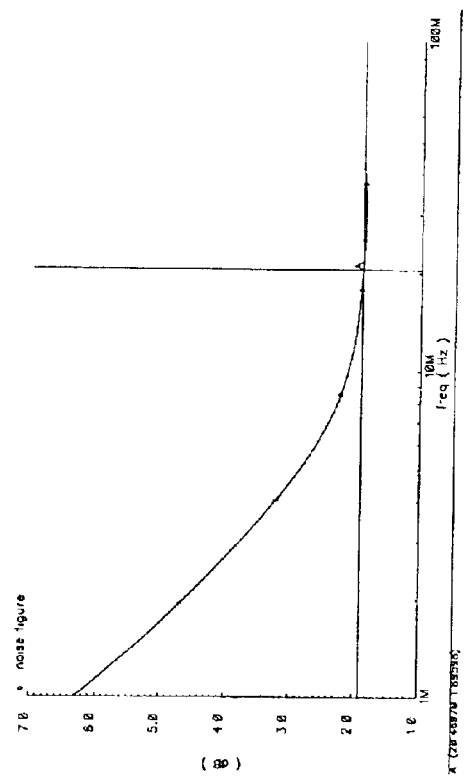
FIGS. 4A and 4B illustrate the test performance of the radio frequency front-end receiver of the present invention.
Figure 4B:
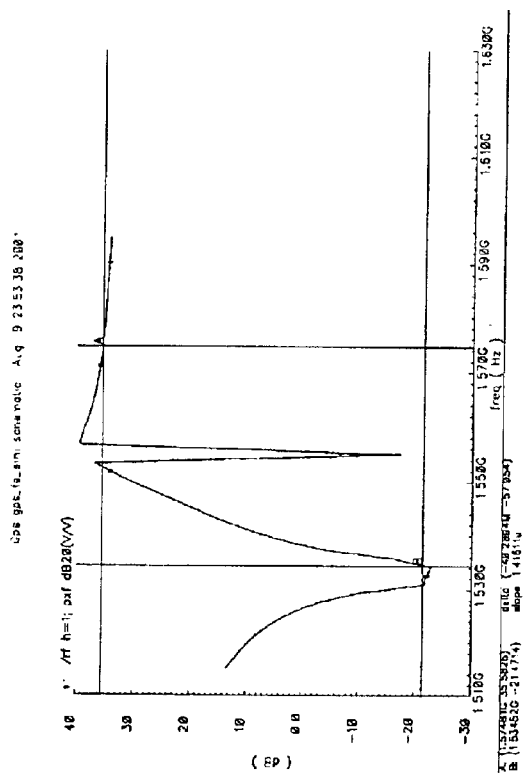

FIGS. 4A and 4B illustrate the performance of the radio frequency front-end receiver according to the present invention. FIG. 4A shows the conversion gain of the receiver. Within the 2.4~2.5 GHz radio frequency range, the present invention has a gain of approximately 35 dB. FIG. 4B shows the noise figure of the receiver. Within the same radio frequency range, the noise figure of the receiver is about 1.9 dB.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A radio frequency front-end receiver for wireless communication, comprising:

a single stage low noise amplifier having a resistor array for adjusting power gain of said receiver, and a capacitor array for tuning said receiver to achieve optimal gain at an operating frequency; and a mixer having a PMOS transconductance stage, a high impedance inductor and a serial current source connected to a Gilbert-type mixer, said PMOS transconductance stage including first and second PMOS transistors, and said serial current source including a pair of MOS transistors;

wherein said first and second PMOS transistors reduce power consumption of said mixer under given gain and linearity constraints, said high impedance inductor provides high impedance at said operating frequency, and said pair of MOS transistors provides high output impedance and a high common-mode rejection ratio for said mixer.

2. The radio frequency front-end receiver for wireless communication as claimed in claim 1, wherein said resistor array comprises a plurality of resistor devices connected in parallel, each of said resistor devices having a resistor connected in serial with a switch.

3. The radio frequency front-end receiver for wireless communication as claimed in claim 1, wherein said resistor array comprises a plurality of resistor devices connected in parallel, each of said resistor devices having a voltage controlled variable resistor.

4. The radio frequency front-end receiver for wireless communication as claimed in claim 1, wherein said capacitor array comprises a plurality of capacitor devices connected in parallel, each of said capacitor devices having a capacitor connected in serial with a switch.

5. The radio frequency front-end receiver for wireless communication as claimed in claim 1, wherein said capacitor array comprises a plurality of capacitor devices connected in parallel, each of said capacitor devices having a voltage controlled variable capacitor.

6. The radio frequency front-end receiver for wireless communication as claimed in claim 1, wherein said single stage low noise amplifier comprises a first inductor, a first MOS transistor, a second MOS transistor and a second inductor connected in serial.

7. The radio frequency front-end receiver for wireless communication as claimed in claim 6, wherein a first end of said first inductor is connected to said first MOS transistor, and said resistor array has a first end connected to a second end of said first inductor and a second end connected to a positive voltage supply.

8. The radio frequency front-end receiver for wireless communication as claimed in claim 7, wherein said capacitor array has a first end connected to said first end of said first inductor and a second end connected to ground.

9. The radio frequency front-end receiver for wireless communication as claimed in claim 6, wherein said first PMOS transistor has a source connected to a source of said second PMOS transistor and a first end of said high impedance inductor, a gate connected to a gate of a third MOS transistor, and a drain connected to a drain of said third MOS transistor, and said second PMOS transistor has a gate connected to a gate of a fourth MOS transistor, and a drain connected to a drain of said fourth MOS transistor.

10. The radio frequency front-end receiver for wireless communication as claimed in claim 9, wherein said serial current source has a first end connected to a source of said third MOS transistor and a source of said fourth MOS transistor, and a second end connected to ground.

11. The radio frequency front-end receiver for wireless communication as claimed in claim 6, wherein said mixer further comprises fifth, sixth, seventh and eighth MOS transistors.

* * * * *